United States Patent
Schmidt et al.

(10) Patent No.: US 9,642,247 B2
(45) Date of Patent: May 2, 2017

(54) METAL-CERAMIC SUBSTRATE AND METHOD FOR PRODUCING A METAL-CERAMIC SUBSTRATE

(71) Applicant: CURAMIK ELECTRONICS GMBH, Eschenbach (DE)

(72) Inventors: Karsten Schmidt, Eschenbach (DE); Andreas Meyer, Wenzenbach (DE); Alexander Legath, Waldershof (DE); Martina Schmirler, Michelfeld (DE)

(73) Assignee: ROGERS GERMANY GMBH, Eschenbach (DE)

( * ) Notice: Subject to any disclaimer, the term of this patent is extended or adjusted under 35 U.S.C. 154(b) by 132 days.

(21) Appl. No.: 14/428,839

(22) PCT Filed: Sep. 16, 2013

(86) PCT No.: PCT/DE2013/100329
§ 371 (c)(1),
(2) Date: Mar. 17, 2015

(87) PCT Pub. No.: WO2014/067511
PCT Pub. Date: May 8, 2014

(65) Prior Publication Data
US 2015/0230334 A1   Aug. 13, 2015

(30) Foreign Application Priority Data
Oct. 29, 2012   (DE) .................. 10 2012 110 322

(51) Int. Cl.
*C04B 37/02*   (2006.01)
*C04B 35/119*   (2006.01)
(Continued)

(52) U.S. Cl.
CPC .......... *H05K 1/0306* (2013.01); *C04B 35/111* (2013.01); *C04B 35/119* (2013.01);
(Continued)

(58) Field of Classification Search
None
See application file for complete search history.

(56) References Cited

U.S. PATENT DOCUMENTS

| | | | |
|---|---|---|---|
| 2005/0119107 A1* | 6/2005 | Shikata | C04B 35/119 501/105 |
| 2006/0063661 A1* | 3/2006 | Cohen | C04B 35/119 501/105 |

(Continued)

FOREIGN PATENT DOCUMENTS

| | | | | |
|---|---|---|---|---|
| DE | 4029066 A1 * | 3/1992 | | C04B 35/119 |
| DE | 102012012620 | 1/2013 | | |

(Continued)

OTHER PUBLICATIONS

Translation of DE10201201620, Mitsutaka et al. Jan. 3, 2013.*
Translation of DE 102004012231, Shulz-Harder et al., Sep. 29, 2005.*

*Primary Examiner* — David Sample
(74) *Attorney, Agent, or Firm* — Welsh Flaxman & Gitler LLC

(57) ABSTRACT

The invention relates to a metal-ceramic substrate and to a method for the production thereof, the substrate including at least one ceramic layer having first and second surface sides, at least one of the surface sides of which is provided with a metallization, wherein the ceramic material forming the ceramic layer contains aluminum oxide, zirconium dioxide and yttrium oxide. The ceramic layer contains aluminum oxide, zirconium dioxide and yttrium oxide in the following proportions, in each case in relation to the total weight thereof: zirconium dioxide between 2 and 15 percent by weight; yttrium oxide between 0.01 and 1 percent by weight; and aluminum oxide between 84 and 97 percent by weight, wherein the average grain size of the aluminum oxide used is between 2 and 8 micrometers and the ratio of the length (Continued)

of the grain boundaries of the aluminum oxide grains to the total length of all the grain boundaries is greater than 0.6.

13 Claims, 4 Drawing Sheets

(51) Int. Cl.
  *H05K 1/03* (2006.01)
  *H05K 1/09* (2006.01)
  *C04B 35/111* (2006.01)

(52) U.S. Cl.
  CPC .......... *C04B 37/021* (2013.01); *C04B 37/023* (2013.01); *C04B 37/026* (2013.01); *C04B 37/028* (2013.01); *H05K 1/09* (2013.01); *C04B 2235/3225* (2013.01); *C04B 2235/3244* (2013.01); *C04B 2235/5248* (2013.01); *C04B 2235/5436* (2013.01); *C04B 2235/786* (2013.01); *C04B 2235/96* (2013.01); *C04B 2235/9607* (2013.01); *C04B 2237/343* (2013.01); *C04B 2237/402* (2013.01); *C04B 2237/407* (2013.01); *C04B 2237/62* (2013.01); *C04B 2237/704* (2013.01); *C04B 2237/706* (2013.01); *C04B 2237/86* (2013.01); *H05K 2201/0175* (2013.01); *H05K 2201/032* (2013.01); *H05K 2201/062* (2013.01); *Y10T 156/10* (2015.01); *Y10T 428/26* (2015.01); *Y10T 428/266* (2015.01)

(56) References Cited

U.S. PATENT DOCUMENTS

| | | | |
|---|---|---|---|
| 2012/0077023 A1* | 3/2012 | Nagahiro | C04B 35/119 428/328 |
| 2012/0252656 A1* | 10/2012 | Kuntz | C04B 35/6455 501/135 |

FOREIGN PATENT DOCUMENTS

| | | |
|---|---|---|
| EP | 2415728 | 2/2012 |
| JP | 2007269524 | 10/2007 |

* cited by examiner

US 9,642,247 B2

METAL-CERAMIC SUBSTRATE AND METHOD FOR PRODUCING A METAL-CERAMIC SUBSTRATE

BACKGROUND OF THE INVENTION

The invention relates to a metal-ceramic substrate having at least one ceramic layer with first and second surface sides and a metallization provided on at least one of the surface sides, wherein the ceramic material forming the ceramic layer contains aluminium oxide, zirconium dioxide as well as yttrium oxide. The invention also relates to a method for producing a metal-ceramic substrate having at least one ceramic layer with first and second surface sides, wherein at least one of the surface sides is extensively bonded with at least one metallization wherein the ceramic layer is produced from a ceramic material including aluminium oxide, zirconium dioxide as well as yttrium oxide.

Metal-ceramic substrates in the form of printed circuit boards consisting of an insulator layer made from ceramic, and at least one metallization bonded to one of the surface sides of the insulator layer of ceramic and structured to form strip conductors, contacts, contact or attachment zones, are known in a wide variety of types.

Increasing the thermal conductivity of the ceramic layer is desirable in order to reduce the layer thickness of the metallization applied to a ceramic layer. In this regard, German Patent No. DE 10 2004 012 231 B4, for example, discloses a metallized ceramic substrate in which, in order to obtain a high mechanical strength and a high thermal conductivity, the ceramic layer is produced from a ceramic material containing a proportion of zirconium dioxide. In addition to aluminium oxide ($Al_2O_3$), the ceramic material contains zirconium dioxide ($ZrO_2$) as well as yttrium oxide ($Y_2O_3$) and/or calcium oxide (CaO), wherein the $Al_2O_3$, $ZrO_2$ and $Y_2O_3$ and/or CaO are contained in the ceramic layer in the following proportions with respect to the total weight of this layer:

$Al_2O_3$ between 91% and 97.96% by weight;
$ZrO_2$ between 2% and 9% by weight; and
$Y_2O_3$ and/or CaO between 0.04% and 1% by weight.

The thermal conductivity of a ceramic layer of that type is between 20 and 23 W/mK at room temperature. However, a further increase in the thermal conductivity would be desirable, while retaining or only slightly worsening the bending strength of the ceramic layer or the metallized ceramic substrate.

The so-called "DCB process" (Direct Copper Bonding) is, for example, known for bonding metal layers or sheets, preferably copper sheets or films, to each other and/or to ceramic or ceramic layers, namely using metal or copper sheets or metal or copper films which have a layer or a coating (fusion layer) on their surface sides made from a chemical compound of the metal and a reactive gas, preferably oxygen. In that process described, for example, in U.S. Pat. No. 3,744,120 or German Patent No. DE 23 19 854, that layer or coating (fusion layer) forms a eutectic with a melting temperature below the melting temperature of the metal (for example copper) so that by depositing the metal or copper film on the ceramic and heating all of the layers, they can be bonded together by fusion of the metal or copper essentially only in the region of the fusion layer or oxide layer. A DCB process of this type thus comprises the following process steps, for example:

oxidizing a copper film in a manner so as to form a uniform layer of copper oxide;
depositing the copper film with the uniform copper oxide layer onto the ceramic layer;
heating the assembly to a process temperature between approximately 1025° C. and 1083° C., for example to about 1071° C.;
cooling to room temperature.

Furthermore, documents German Patent No. DE 22 13 115 and European Patent No. EP-A-153 618 disclose the so-called active solder method for bonding metal layers or metal films which form metallizations, in particular copper layers or copper films, with a ceramic material or a ceramic layer. In that process, which in particular is also used for the production of metal-ceramic substrates, a compound between a metal film, for example copper film, and a ceramic substrate, for example an aluminium nitride ceramic, is formed at a temperature in the range about 800-1000° C. using a hard solder which, in addition to the major components such as copper, silver and/or gold, also contains an active metal. This active metal, which for example, is at least one element from the group Hf, Ti, Zr, Nb, Ce, by means of a chemical reaction, produces a bond between the hard solder and the ceramic, while the bond between the hard solder and the metal is a metallic hard solder bond.

From the prior art cited above, it is an object of the invention to provide a metal-ceramic substrate, and also an associated method for its production, which comprises a ceramic material containing a proportion of zirconium dioxide and with an improved thermal conductivity.

SUMMARY OF THE INVENTION

An essential aspect of the metal-ceramic substrate, according to the invention, may be considered to be in the fact that aluminium oxide, zirconium dioxide as well as yttrium oxide are contained in the ceramic layer in the following proportions with respect to its total weight: zirconium dioxide between 2% and 15% by weight; yttrium oxide between 0.01% between 1% by weight and aluminium oxide between 84% and 97% by weight, wherein the average grain size of the aluminium oxide employed is between 2 and 8 micrometers and the ratio of the length of the grain boundaries of the aluminium oxide grains to the total length of all the grain boundaries is selected so as to be greater than 0.6. With the ceramic layer, according to the invention, comprising a proportion of zirconium dioxide between 2% and 15% by weight and using aluminium oxide with an average grain size between 2 and 8 micrometers, an increase in the thermal conductivity of up to 10% could be obtained. Particularly advantageously, the ceramic layer has a thermal conductivity of more than 25 W/mK. This means that it is possible to reduce the layer thickness of the metallization by up to 0.05 mm, depending on the application.

In an advantageous embodiment of the invention, the proportion of zirconium dioxide is between 2% and 10% by weight, the proportion of yttrium oxide is between 0.01% and 1% by weight and the proportion of aluminium oxide is between 89% and 97% by weight. By reducing the zirconium dioxide proportion to less than 10% by weight and preferably simultaneously increasing the sintering temperature, a further substantial improvement in the thermal conductivity could be obtained, but too high a sintering temperature leads to a reduction in the bending strength.

In a further embodiment of the invention, the bending strength of the ceramic layer is greater than 500 MPa.

In an advantageous variation of the invention, the zirconium dioxide in the crystalline phase has a mainly tetragonal crystalline structure, wherein the proportion of the tetragonal crystalline structure in the overall crystalline structure of the zirconium dioxide is more than 80%. Increasing the tetragonal crystalline structure of the crystalline phases and the associated expulsion of the glass phases from the ceramic also acts to improve the thermal conductivity.

In a further embodiment of the invention, the metal-ceramic substrate according to the invention is, for example, such that the ceramic layer has a layer thickness between 0.1 mm and 1.0 mm, preferably between 0.2 mm and 0.5 mm, and/or the metallization has a layer thickness between 0.05 mm and 1.2 mm, preferably between 0.1 mm and 0.5 mm, and/or the metallization is structured so as to form contact or bonding faces, and/or the metallization is formed by a film or layer of copper or a copper alloy and/or aluminium or an aluminium alloy, wherein the cited features can respectively be employed individually or in any combination.

The invention also pertains to a method for the production of a metal-ceramic substrate comprising at least one ceramic layer with first and second surface sides, wherein at least one of the surface sides is bonded with at least one metallization, wherein the ceramic layer is produced from a ceramic material comprising aluminium oxide, zirconium dioxide as well as yttrium oxide. In accordance with the invention, for the production of the ceramic layer, the following proportions of aluminium oxide, zirconium dioxide as well as yttrium oxide are used with respect to the total weight of the ceramic layer: zirconium dioxide between 2% and 15% by weight; yttrium oxide between 0.01% and 1% by weight and aluminium oxide between 84% and 97% by weight, wherein the average grain size of the aluminium oxide employed is in the range 2 to 8 micrometers and the ratio of the length of the grain boundaries of the aluminium oxide grains to the total length of all the grain boundaries is selected so as to be greater than 0.6.

In a further aspect, the method of the invention is characterized in that, when forming the at least one metallization in the form of a film or layer of copper or a copper alloy, the metallization is bonded to the ceramic layer with the aid of a "direct copper bonding" process or an active solder process or by adhesion using a synthetic adhesive or a polymer which is suitable for use as an adhesive, preferably using an adhesive which contains carbon fibres, in particular carbon nanofibres, and/or when forming the at least one metallization in the form of a film or layer of aluminium or an aluminium alloy, the metallization is bonded to the ceramic layer with the aid of a "direct aluminium bonding" process (DAB process) or by adhesion using a synthetic adhesive or a polymer which is suitable for use as an adhesive, preferably using an adhesive which contains carbon fibres, in particular carbon nanofibres, wherein the cited features can respectively be employed individually or in combination.

More advantageously, to produce the ceramic layer, zirconium dioxide is used which has a mainly tetragonal crystalline structure in the crystalline phase, wherein the proportion of tetragonal crystalline structure in the overall crystalline structure of the zirconium dioxide is more than 80%.

The expressions "approximately", "essentially" or "about" as used in the context of the invention mean variations from the respective exact value by ±10%, preferably by ±5% and/or variations in the form of changes which are of no significance to the function.

Further embodiments, advantages and possible applications of the invention will become apparent from the following description of exemplary embodiments and from the figures. In this respect, all of the described and/or illustrated features, individually or on any combination, comprise the subject matter of the invention, irrespective of whether they are embodied in the claims or irrespective of their dependencies.

BRIEF DESCRIPTION OF THE DRAWINGS

The invention will now be described in more detail with the aid of the accompanying drawings and exemplary embodiments.

DETAILED DESCRIPTION OF THE INVENTION

Figure 1:
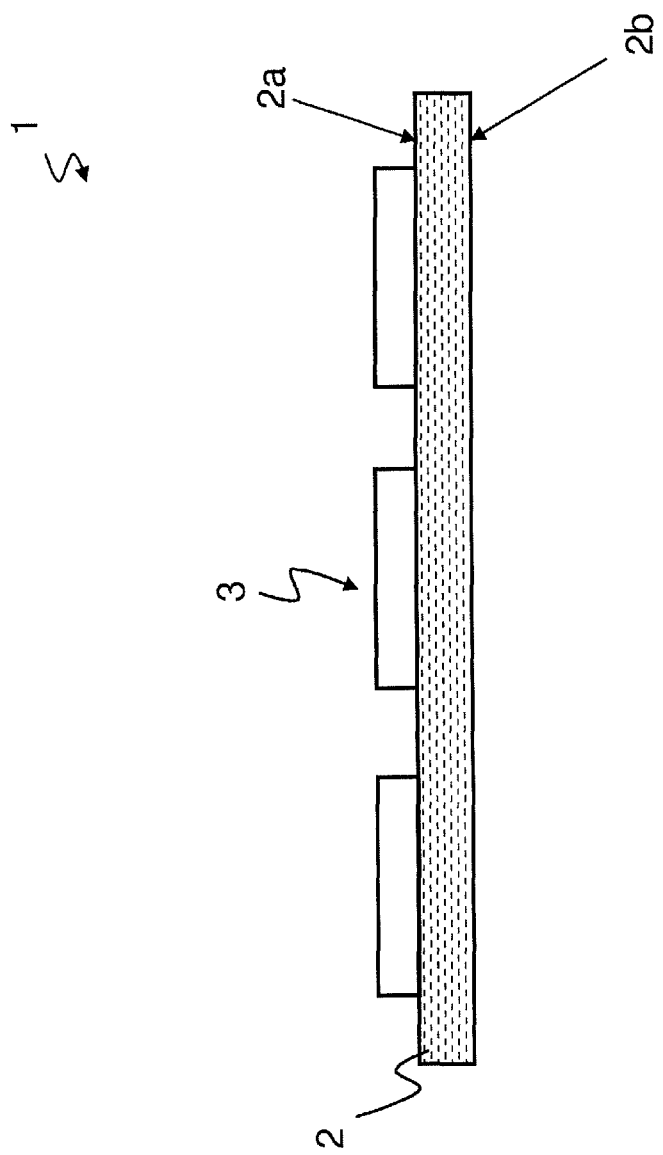
FIG. 1 is a simplified sectional view through a metal-ceramic substrate in accordance with the invention with one metallization.

FIG. 1 shows a simplified view of a section through a metal-ceramic substrate 1 of the invention comprising at least one ceramic layer 2 with two opposing surface sides, namely a first and a second surface side 2a, 2b.

The metal-ceramic substrate 1 of the invention in FIG. 1 is provided with at least one metallization 3. In the present embodiment, the first surface side 2a is provided with a first metallization 3 and the second surface side 2b, which is opposite the first surface side 2a, does not have a metallization.

Figure 2:
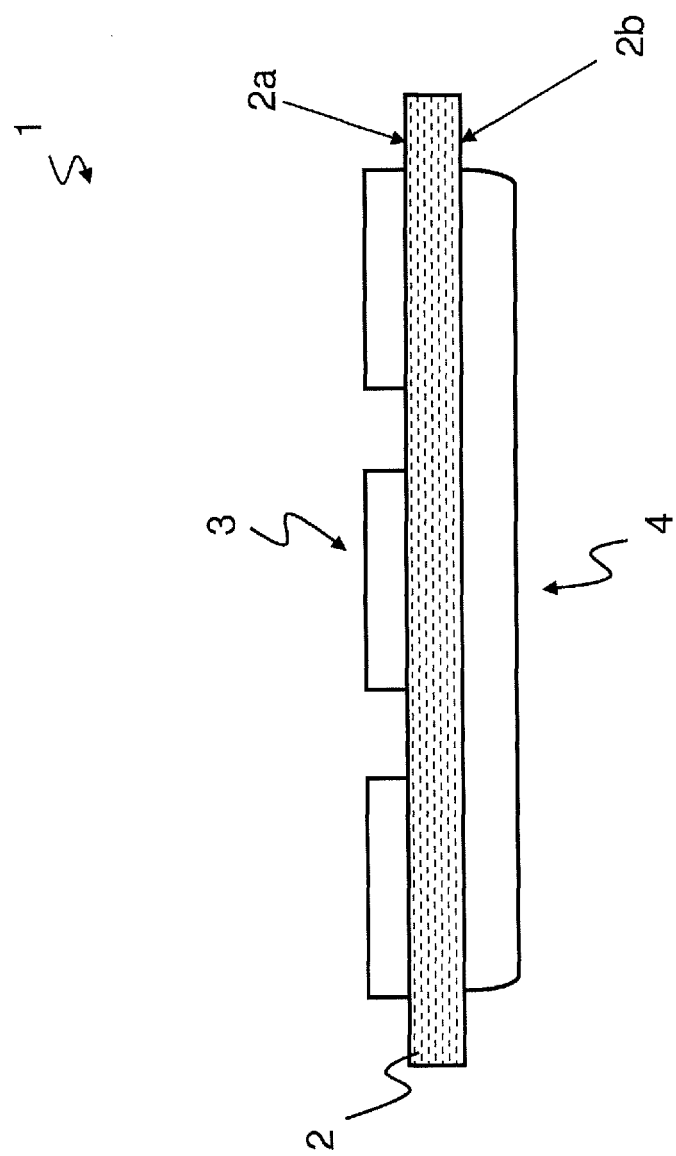
FIG. 2 is a simplified sectional view through a metal-ceramic substrate in accordance with the invention with two metallizations.
Figure 3:
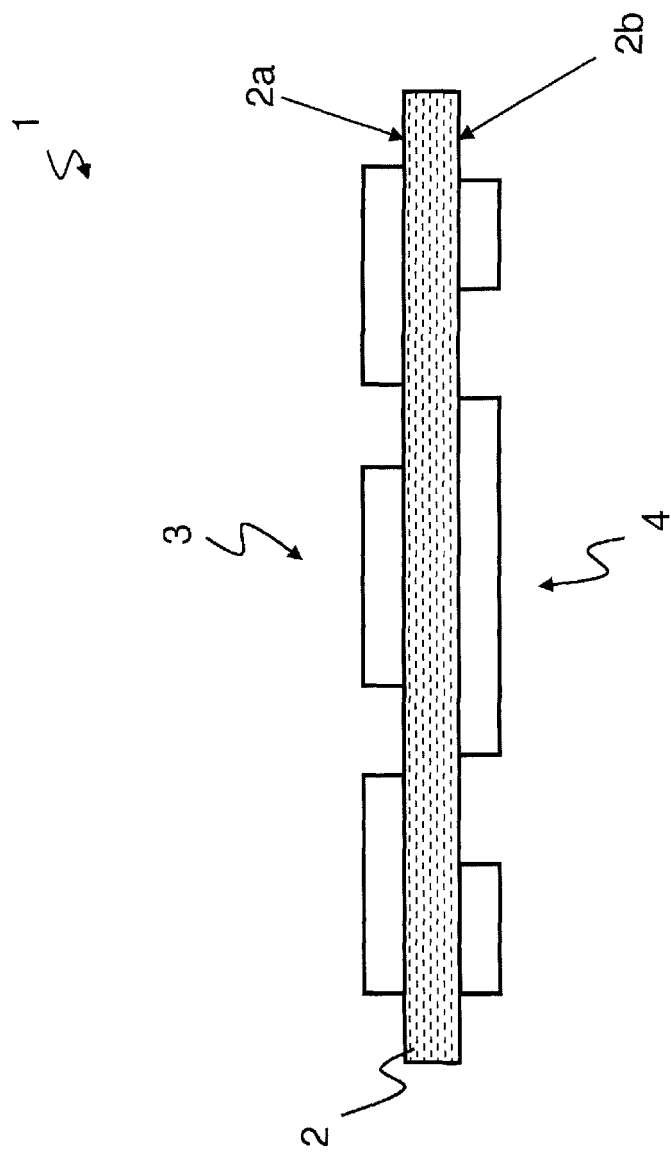
FIG. 3 is a simplified sectional view of an alternative embodiment of the metal-ceramic substrate of FIG. 2 with two metallizations.

FIG. 2 and FIG. 3 show two alternative variational embodiments of a metal-ceramic substrate 1 of the invention in which the first surface 2a is provided with a first metallization 3 and the second surface 2b, which is opposite first surface 2a, is provided with a second metallization 4.

The first and/or second metallizations 3, 4 are preferably structured, i.e. form a plurality of contact zones or contact surfaces for the connection of electronic components. FIG. 1 and FIG. 2 respectively show, by way of example, a structured first metallization 3 and FIG. 3 shows a structured first and second metallization 3, 4.

Metal-ceramic substrates 1 of this type are used in a known manner as printed circuit boards for electrical or electronic circuits or circuit modules, in particular for power circuits. In this regard, the structuring of the metallizations 3, 4 is obtained using the usual techniques, such as masking and etching techniques, for example.

In accordance with the invention, the ceramic material used to produce the ceramic layer 2 of the metal-ceramic substrate 1 comprises aluminium oxide ($Al_2O_3$), zirconium dioxide ($ZrO_2$) as well as yttrium oxide ($Y_2O_3$). The aluminium oxide, zirconium dioxide and yttrium oxide in the ceramic layer 2 are present in the following proportions with respect to the total weight of the ceramic layer 2:

zirconium dioxide between 2% and 15% by weight;
yttrium oxide between 0.01% and 1% by weight; and
aluminium oxide between 84% and 97% by weight.

The average grain size of the aluminium oxide used here is between 2 and 8 micrometer. Even better thermal conductivity is obtained in particular with a composition using the following proportions:

zirconium dioxide between 2% and 10% by weight;
yttrium oxide between 0.01% and 1% by weight; and
aluminium oxide between 89% and 97% by weight.

The ceramic layer 2 has a crystalline structure, i.e. it is composed of a plurality of crystallites or grains which border each other directly. Crystallites or grains with different orientations but otherwise identical crystalline structures are separated from each other by so-called grain boundaries. If the ratio of the length of the grain boundaries of the aluminium oxide grains to the total length of the grain boundaries of the grains of all of the constituents is selected so as to be more than 0.6, the thermal conductivity is substantially improved. In addition, the strength of the ceramic layer 2 is substantially increased. The thermal conductivity of the ceramic layer 2 is preferably more than 25 W/mK, i.e. compared with known ceramic layers 2 containing a proportion of zirconium dioxide, resulting in an increase from 8 to 10 percent.

Preferably, the zirconium dioxide used in the crystalline phase has a mainly tetragonal crystalline structure, wherein the proportion of the tetragonal crystalline structure in the overall crystalline structure of the zirconium dioxide is more than 80 percent.

Furthermore, the ceramic layer 2 has a layer thickness between 0.1 mm and 1.0 mm, preferably between 0.2 mm and 0.5 mm, wherein the bending strength of the ceramic layer 2 is, for example, selected so as to be more than 500 MPa.

The metallization 3, 4 is, for example, formed by a film or layer of copper or a copper alloy and/or aluminium or an aluminium alloy, i.e. combinations of a copper or copper alloy and an aluminium or aluminium alloy may also be envisaged. In this regard, the layer thickness of the metallization 3, 4 is between 0.05 mm and 1.2 mm, preferably between 0.1 mm and 0.5 mm.

Various methods, depending on the materials used for the ceramic layer 2 and the metallizations 3, 4, are suitable for forming the extensive bond between the ceramic layer 2 and the first or second metallization 3, 4.

Thus, a metallization 3, 4 in the form of a film or layer of copper or a copper alloy is bonded to the ceramic layer 2 by, for example, adhesion using a synthetic adhesive or a polymer which is suitable for use as an adhesive, preferably using an adhesive which contains carbon fibres, in particular carbon nanofibres. Alternatively, the extensive bond of the ceramic layer can be produced using the DCB process or with the aid of the active solder process.

A metallization 3, 4 produced from aluminium or an aluminium alloy is bonded with the ceramic layer 2 by, for example, a "direct aluminium bonding" process (DAB process) or by adhesion using a synthetic adhesive or a polymer which is suitable for use as an adhesive, preferably using an adhesive which contains carbon fibres, in particular carbon nanofibres.

Figure 4:
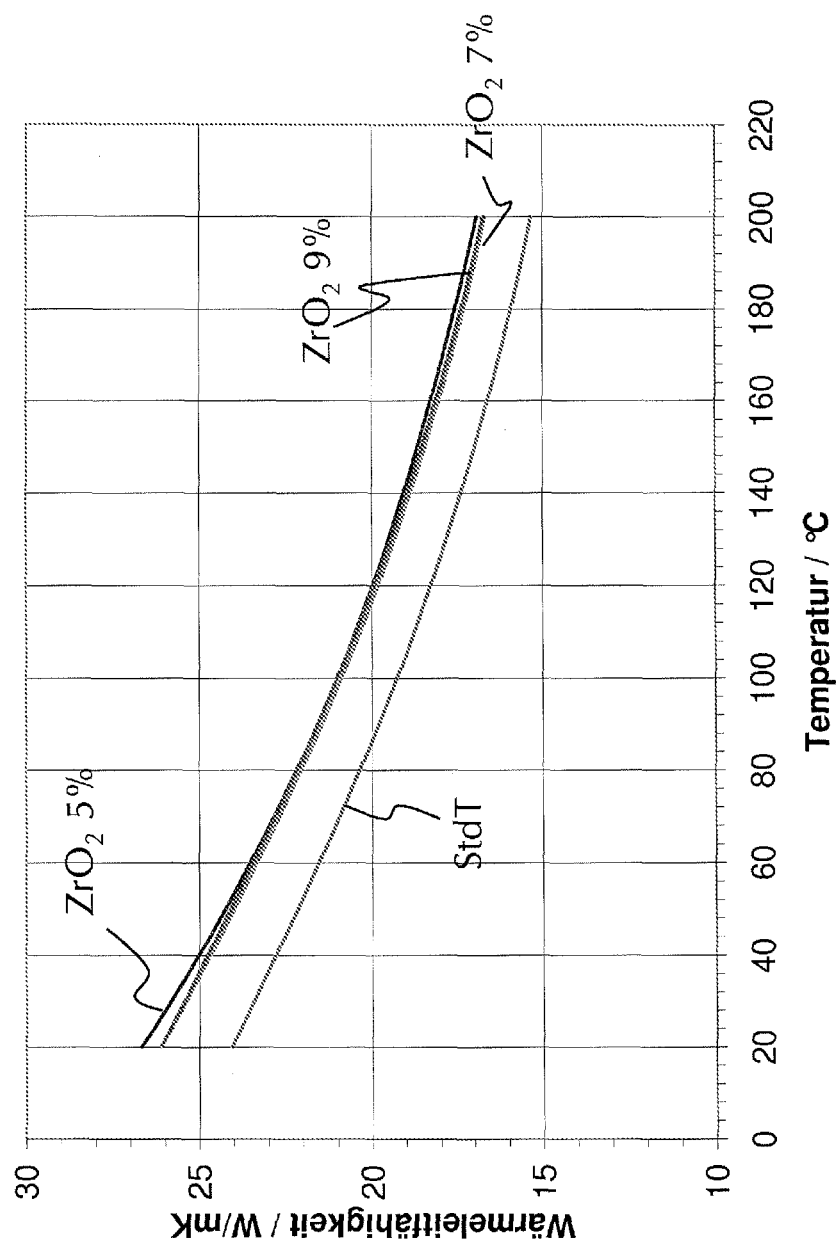
FIG. 4 is a graph of the profile of the thermal conductivity as a function of temperature of a conventional ceramic layer and the ceramic layer with different zirconium oxide proportions used in the metal-ceramic substrate according to the invention.

FIG. 4 shows, by way of example, a diagram of the profile of the thermal conductivity in W/mK as a function of the temperature in ° C. for a conventional ceramic layer in accordance with the prior art and the ceramic layer 2 with different proportions of zirconium oxide used in the metal-ceramic substrate according to the invention, namely a ceramic layer with a $ZrO_2$ proportion of 5%, a ceramic layer with a $ZrO_2$ proportion of 7% and a ceramic layer with a $ZrO_2$ proportion of 9%. This shows that the thermal conductivity at room temperature at approximately 24° C. is over 25 W/mK, and thus the thermal conductivity is increased by about 8-10%.

The invention has been described with the aid of exemplary embodiments. It should be understood that many changes and variations are possible without departing from the spirit and scope of the inventive concept underlying the present invention.

LIST OF REFERENCE NUMERALS 1 metal-ceramic substrate
2 ceramic layer
2a first surface side
2b second surface side
3 first metallization
4 second metallization

The invention claimed is:

1. A metal-ceramic substrate comprising at least one ceramic having first and second surface sides, the at least one ceramic layer being provided with a metallization on at least one of the surface sides, wherein a ceramic material forming the at least one ceramic layer contains aluminium oxide, zirconium dioxide and yttrium oxide, wherein the proportions of the aluminium oxide, the zirconium dioxide, and the yttrium oxide in the at least one ceramic layer are as follows with respect to the total weight thereof:

zirconium dioxide between 2% and 15% by weight;
yttrium oxide between 0.01% and 1% by weight; and
aluminium oxide between 84% and 97% by weight,
wherein an average grain size of the aluminium oxide used is between 2 and 8 micrometers and a ratio of a length of grain boundaries of aluminium oxide grains to a total length of all grain boundaries is greater than 0.6.

2. The metal-ceramic substrate according to claim 1, wherein the proportions of the aluminium oxide, the zirconium dioxide, and the yttrium oxide in the at least one ceramic layer are as follows with respect to the total weight thereof:

zirconium dioxide between 2% and 10% by weight;
yttrium oxide between 0.01% and 1% by weight; and
aluminium oxide between 89% and 97% by weight.

3. The metal-ceramic substrate according to claim 1, wherein the at least one ceramic layer comprises a thermal conductivity of more than 25 W/mK.

4. The metal-ceramic substrate according to claim 1, wherein the at least one ceramic layer comprises a bending strength of more than 500 MPa.

5. The metal-ceramic substrate according to claim 1, wherein the at least one ceramic layer has a layer thickness between 0.1 mm and 1.0 mm.

6. The metal-ceramic substrate according to claim 1, wherein the zirconium dioxide in a crystalline phase has a tetragonal crystalline structure, and wherein a proportion of the tetragonal crystalline structure in an overall crystalline structure of the zirconium dioxide is more than 80 percent.

7. The metal-ceramic substrate according to claim 1, wherein the metallization has a layer thickness between 0.05 mm and 1.2 mm.

8. The metal-ceramic substrate according to claim 1, wherein the metallization is structured so as to form contact or bonding faces.

9. The metal-ceramic substrate according to claim 1, wherein the metallization is formed by a layer of copper or a copper alloy and/or a layer of aluminium or an aluminium alloy.

10. A method for production of a metal-ceramic substrate comprising at least one ceramic layer, the at least one ceramic layer having a first and second surface side, comprising the steps of:
bonding at least one of the surface sides with at least one metallization, wherein the at least one ceramic layer is produced from a ceramic material comprising aluminium oxide, zirconium dioxide and yttrium oxide, and
producing the at least one ceramic layer with proportions of the aluminium oxide, the zirconium dioxide and the yttrium oxide with respect to the total weight of the at least one ceramic layer in proportions as follows:
zirconium dioxide between 2% and 15% by weight;
yttrium oxide between 0.01% and 1% by weight; and
aluminium oxide between 84% and 97% by weight; and
utilizing an average grain size of the aluminium oxide between 2 and 8 micrometers and a ratio of a length of grain boundaries of the aluminium oxide grains to a total length of all grain boundaries greater than 0.6.

11. The method according to claim 10, wherein when forming the at least one metallization in a form of a film or layer of copper or a copper alloy, the at least one metallization is bonded to the ceramic layer by a direct copper bonding process, an active solder process, or by adhesion using a synthetic adhesive or a polymer which is suitable for use as an adhesive.

12. The method according to claim 10 wherein when forming the at least one metallization in the form of a film or layer of aluminium or an aluminium alloy, the at least one metallization is bonded to the ceramic layer by a direct aluminium bonding process or by adhesion using a synthetic adhesive or a polymer which is suitable for use as an adhesive.

13. The method according to claim 10, wherein in order to produce the at least one ceramic layer zirconium dioxide, a crystalline phase of which has a mainly tetragonal crystalline structure is used, wherein a proportion of tetragonal crystalline structure in an overall crystalline structure of the zirconium dioxide is more than 80 percent.

* * * * *